United States Patent
Ito et al.

(10) Patent No.: US 7,855,414 B2
(45) Date of Patent: Dec. 21, 2010

(54) SEMICONDUCTOR DEVICE WITH INCREASED BREAKDOWN VOLTAGE

(75) Inventors: Akira Ito, Irvine, CA (US); Henry Kuo-Shun Chen, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

(21) Appl. No.: 11/580,961

(22) Filed: Oct. 16, 2006

(65) Prior Publication Data
US 2008/0023760 A1     Jan. 31, 2008

Related U.S. Application Data

(60) Provisional application No. 60/833,787, filed on Jul. 28, 2006.

(51) Int. Cl.
*H01L 29/94* (2006.01)
*H01L 29/76* (2006.01)

(52) U.S. Cl. .................. 257/335; 257/344; 257/339

(58) Field of Classification Search .................. 257/335, 257/336, 339, 344, 343, 387, 384, 362, 346
See application file for complete search history.

(56) References Cited

U.S. PATENT DOCUMENTS

| | | | |
|---|---|---|---|
| 6,034,388 A * | 3/2000 | Brown et al. ................. 257/296 |
| 6,211,552 B1 * | 4/2001 | Efland et al. ................. 257/343 |
| 6,580,156 B1 | 6/2003 | Ito et al. |
| 6,700,176 B2 | 3/2004 | Ito et al. |
| 6,798,684 B2 | 9/2004 | Low et al. |
| 6,960,819 B2 | 11/2005 | Chen et al. |
| 7,161,213 B2 | 1/2007 | Ito et al. |
| 7,405,446 B2 | 7/2008 | Agam et al. |
| 2003/0127689 A1 * | 7/2003 | Hebert ........................ 257/336 |
| 2004/0157379 A1 | 8/2004 | Ito et al. |
| 2005/0052892 A1 | 3/2005 | Low et al. |
| 2005/0236666 A1 * | 10/2005 | Wang .......................... 257/339 |
| 2006/0124999 A1 * | 6/2006 | Pendharkar ................. 257/335 |
| 2006/0261408 A1 * | 11/2006 | Khemka et al. ............. 257/335 |
| 2008/0036033 A1 | 2/2008 | Ito et al. |
| 2008/0246080 A1 | 10/2008 | Ito et al. |

* cited by examiner

*Primary Examiner*—Kenneth A Parker
*Assistant Examiner*—Joseph Nguyen
(74) *Attorney, Agent, or Firm*—Sterne, Kessler, Goldstein & Fox P.L.L.C.

(57) ABSTRACT

Optimization of the implantation structure of a metal oxide silicon field effect transistor (MOSFET) device fabricated using conventional complementary metal oxide silicon (CMOS) logic foundry technology to increase the breakdown voltage. The techniques used to optimize the implantation structure involve lightly implanting the gate region, displacing the drain region from the gate region, and implanting P-well and N-well regions adjacent to one another without an isolation region in between.

27 Claims, 6 Drawing Sheets

FIG. 1 (CONVENTIONAL)

SEMICONDUCTOR DEVICE WITH INCREASED BREAKDOWN VOLTAGE

CROSS-REFERENCE TO RELATED APPLICATIONS

This patent application claims priority to and is entitled to the benefit of Provisional Patent Application No. 60/833,787, filed Jul. 28, 2006, entitled "Semiconductor Device with Increased Breakdown Voltage," which is incorporated herein by reference in its entirety.

BRIEF SUMMARY

In one embodiment, a MOSFET includes a lightly implanted gate, a heavily implanted drain displaced from the gate, and well regions that begin under a shallow trench isolation region located on opposite sides of a MOSFET device and end in contact with each other under the polysilicon gate. The MOSFET device can be fabricated using conventional complementary metal oxide silicon (CMOS) logic foundry technology without additional masking or processing cost.

BACKGROUND OF THE INVENTION

1. Field of the Invention

The present invention generally relates to semiconductors. More specifically, the invention relates to increasing the breakdown voltage of a semiconductor device.

2. Background Art

Silicon semiconductor processing has evolved sophisticated operations for fabricating integrated circuits. As advancement in fabrication process technology continues, the operating voltage of the integrated circuits has reduced, but the operating voltage of auxiliary devices remains the same. Auxiliary devices are devices used in conjunction with integrated circuits and can include printers, scanners, disk drives, tape drives, microphones, speakers, cell phones and cameras to provide some examples.

Auxiliary devices can operate at voltages above the breakdown voltage of the transistors contained within the integrated circuit. As the operating voltage applied to a transistor increases, the transistor will eventually breakdown allowing an uncontrollable increase in current to pass through the devices. Breakdown voltage is the voltage level where this uncontrollable increase in current occurs. Examples of breakdown can include punch-through, avalanche breakdown, and gate oxide breakdown to provide some examples. Operating above the breakdown voltage for a significant duration reduces the lifetime of the transistor.

Techniques are currently available to increase the voltage at which breakdown occurs. These techniques can include the separate design of input-output circuits using a high voltage process, double diffused drain or other extended drain techniques, or the cascading of two individual transistors to provide some examples. These techniques often increase the fabrication cost by requiring additional process steps along with additional substrate masking.

What is needed is a metal oxide semiconductor field effect transistor (MOSFET) device and method for fabricating the same that addresses one or more of the aforementioned shortcomings of conventional MOSFET devices.

BRIEF DESCRIPTION OF THE DRAWINGS/FIGURES

The present invention is described with reference to the accompanying drawings. In the drawings, like reference numbers indicate identical or functionally similar elements. Additionally, the left most digit(s) of a reference number identifies the drawing in which the reference number first appears.

DETAILED DESCRIPTION OF THE INVENTION

Figure 1:
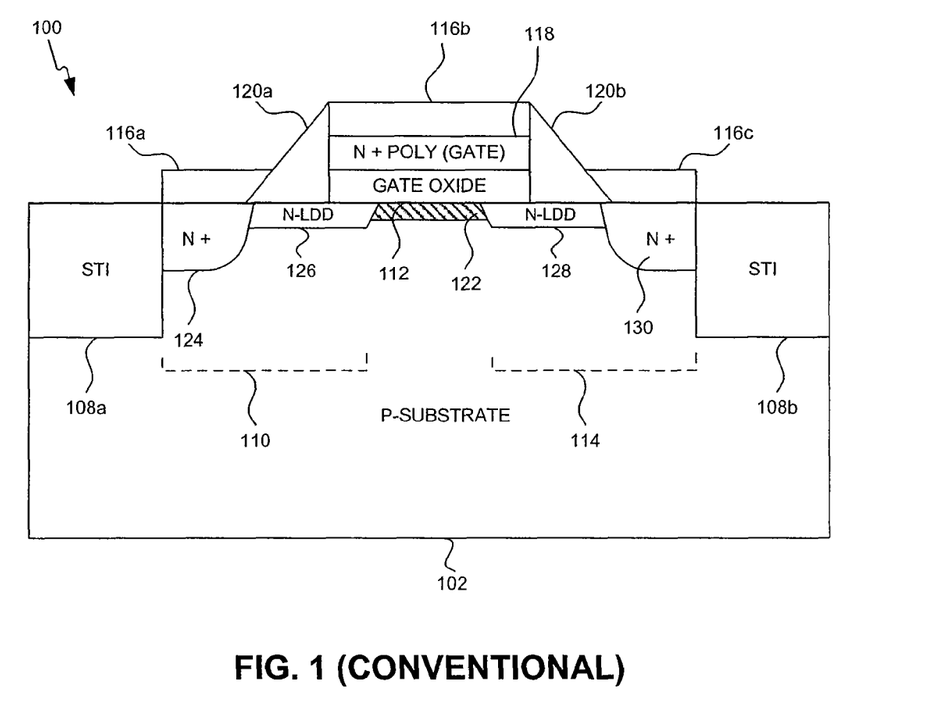
FIG. 1 illustrates a cross-sectional view of an n-type metal oxide semiconductor (NMOS) structure fabricated using a conventional CMOS logic foundry technology.

FIG. 1 illustrates a cross-sectional view of an n-type metal oxide semiconductor (NMOS) structure 100 fabricated using a conventional CMOS logic foundry technology. The conventional CMOS logic foundry technology fabricates NMOS structure 100 onto a p-type substrate 102. Source 110 of NMOS structure 100 includes N+ region 124 and N-LDD region 126. Likewise, drain 114 of NMOS structure 100 includes N+ region 130 and N-LDD region 128. The "+" indicates that the region is implanted with a higher carrier concentration than a region not designated by a "+." For instance, an N+ region generally has a greater number of excess electrons than an N-type region. A P+ region typically has a greater number of excess holes than the P-type substrate. N-LDD region 126 is in contact with N+ region 124 while N-LDD region 128 is in contact with N+ region 130. N-LDD region 126 and N-LDD region 128 are lightly implanted with n-type material to provide a high resistance shallow diffusion region. N-LDD region 126 provides a high resistance shallow diffusion region from N+ region 124 to gate 118 to reduce the effects of the electric field of N+ region 124. N-LDD region 128 provides a high resistance shallow diffusion region from N+ region 130 to gate 118 to reduce the effects of the electric field of N+ region 130.

Shallow trench isolation regions 108a and 108b (hereinafter 108) can provide isolation and protection for NMOS structure 100. Shallow trench isolation region 108a is in contact with source 110 while shallow trench isolation 108b is in contact with drain 114. Shallow trench isolation region 108 is typically a dielectric material such as $SiO_2$, though any suitable material can be used. Spacers 120a and 120b (hereinafter a reference to spacer 120 will refer to spacers 120a and 120b while a reference to 120a or 120b will refer to that particular spacer only) are included at the edges of the gate 118. Spacer 120a is adjacent to source 110 and in contact with gate 118 while spacer 120b is adjacent to drain 114 and in contact with gate 118. Spacers 120 are typically a dielectric material, such as $SiO_2$, though any suitable material can be used. A layer of silicide 116a, 116b, and 116c (hereinafter 116) is formed upon source 110, gate 118, and drain 114 of NMOS structure 100. The primary use of silicide, an alloy of metal and silicon, is to form a low resistance interconnection between other devices within the integrated circuit. Polycrystalline silicon (a silicon structure not having a single-crystalline structure, usually called "poly Si" or "poly") gate 118 is located between source 110 and drain 114 on top of gate oxide 112. A heavy implantation of n-type material into the polycrystalline silicon generally forms gate 118.

A p-n junction is a potential barrier created by joining n-type and p-type material. Without a bias voltage on gate 118, two p-n junctions exist in series between source 110 and drain 114. One such junction is located between drain 114 and substrate 102, and the other junction is between the substrate 102 and source 110. These p-n junctions prevent current conduction from source 110 to drain 114 upon the application of a source to drain voltage. Upon grounding source 110 and applying a positive voltage to gate 118, a voltage appears between gate 118 and source 110. The positive voltage on gate 118 repels the positively charged carrier holes from underneath gate oxide 112. The pushing away of the carrier holes from gate oxide 112 interface into substrate 102 forms a depletion region, or channel 122. Channel 122 is a carrier-depletion region populated by the negative charge formed below the interface at gate oxide 112 and substrate 102 by the electric field created between gate 118 and substrate 102. In addition to repelling the carrier holes, the positive gate voltage attracts carrier electrons from source 110 and drain 114 into channel 122. When a sufficient number of carrier electrons accumulate in channel 122, an n-type region is created connecting source 110 to drain 114. Applying a voltage between drain 114 and source 110 will cause current to flow through channel 122.

The amount of voltage applied between drain 114 and source 110 has a limit. There is a point where the current passing through the p-n junction increases uncontrollably resulting in breakdown. Breakdown voltage is the voltage at which the p-n junctions breakdown. Examples of breakdown can include avalanche breakdown, punch-through, and gate oxide breakdown to provide some examples. As the voltage on drain 114 increases, the p-n junction between drain 114 and substrate 102 will eventually suffer avalanche breakdown resulting in a rapid increase in current. Avalanche breakdown results when carriers under the influence of an electric field gain sufficient energy to break covalent bonds in atoms with which they collide. The electric field accelerates these free electrons to very high speeds knocking other electrons free from other atoms. The electric field once again accelerates both the original electron and the electron knocked free allowing both the original electron and the electron knocked free to strike other atoms knocking more electrons free. As this process continues, an uncontrollable increase in current occurs as a result of an exponential increase in the number of free electrons moving through the material.

In addition to avalanche breakdown, the increase of voltage on drain 114 can lead to another breakdown effect called punch through. Punch through occurs when the voltage on drain 114 is increased to the point causing the depletion region surrounding drain 114 to extend through channel 122 to source 110 causing a rapid increase in current. Related to punch through is the hot carrier effect. The hot carrier effect refers to the effect of high energy electrons or holes generated as a result of impact ionization at the drain side of the channel. These high energy current carriers can leave the silicon and tunnel into gate oxide 112 upon reaching a sufficiently high level of energy. For example, the main cause of the channel hot electrons effect results from the carrier electrons in channel 122 gaining sufficient energy to leave substrate 102 and tunneling into gate oxide 112 causing degradation of NMOS structure 100.

Further, as the operating voltage applied to a transistor increases, the gate to source voltage will eventually cause a breakdown of gate oxide 112. This breakdown of gate oxide 112, results permanent damage to NMOS structure 100.

Figure 2A:
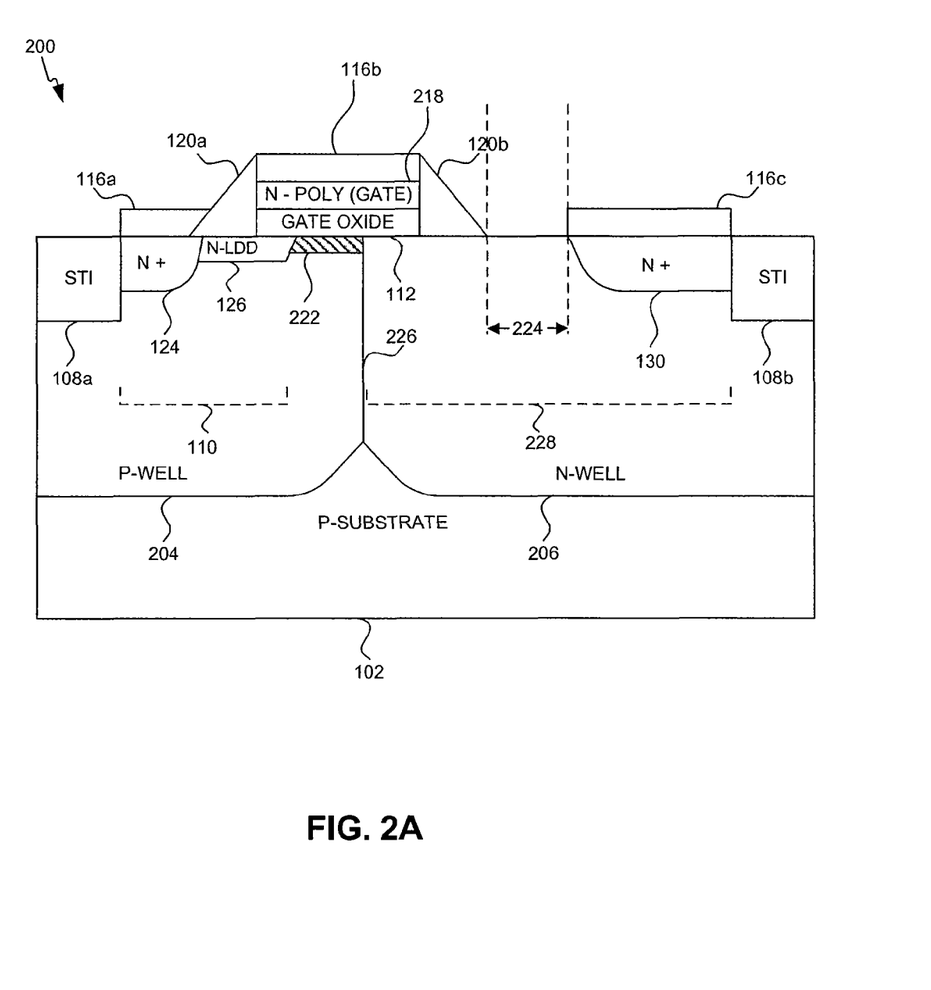
FIG. 2a illustrates a cross-sectional view of an n-type metal oxide semiconductor (NMOS) structure according to an embodiment of the present invention.

FIG. 2A illustrates a cross-sectional view of an n-type metal oxide semiconductor (NMOS) structure according to an embodiment of the present invention. The same conventional CMOS logic foundry technology as NMOS structure 100 fabricates NMOS structure 200, but without the additional masking or processing cost required by existing techniques.

The conventional CMOS logic foundry technology fabricates NMOS structure 200 onto a p-type substrate 102. Source 110 of NMOS structure 200 includes N+ region 124 and N-LDD region 126. N-LDD region 126 is in contact with N+ region 124. N-LDD region 126 is lightly implanted with n-type material to provide a high resistance shallow diffusion region. N-LDD region 126 provides a high resistance shallow diffusion region from N+ region 124 to gate 218 to reduce the effects of the electric field of N+ region 124. Drain 228 of NMOS structure 200 includes N+ region 130 and n-well 206. P-well 204 is located below source 110. Well transition 226 is a region in substrate 102 where a region comprised of n-well 206 changes to a region comprised of p-well 204.

Shallow trench isolation regions 108a and 108b can provide isolation and protection for NMOS structure 200. Shallow trench isolation region 108a is in contact with source 110, while shallow trench isolation 108b is in contact with drain 228. Polycrystalline silicon gate 218 is located in between source 110 and drain 228 on top of gate oxide 112. Channel 222 extends from source 110 to well transition 226 located beneath gate 218. Spacers 120a and 120b are included at the ends of the gate 218. Spacer 120a is adjacent to source 110 and in contact with gate 218 while spacer 120b is adjacent to drain 228 and in contact with gate 218. Placed upon source 110, gate 218, and drain 228 of NMOS structure 200 is a layer of silicide 116.

The resistance from drain 228 to source 110 is related to the point at which punch through occurs. This resistance determines the point at which the depletion region surrounding drain 228 extends through channel 222 to source 110. For example, a transistor with a greater drain to source resistance requires a greater voltage for punch through to occur than a transistor with a lesser drain to source resistance. An exemplary embodiment of NMOS structure 200 displaces N+ region 130 from gate 218 by displacement distance 224 and implants n-well 206 to form the overlap region between gate 218 and drain 228 to increase the resistance from drain 228 to source 110. Displacement distance 224 is the horizontal distance from the edge of spacer 120b to N+ region 130. In an exemplary embodiment, displacement distance 224 is 0.45 µm. To prevent the carriers in channel 222 from prematurely leaving requires adjustment of silicide 116c so that the region on top of substrate 102 between N+ region 130 and gate 218 lacks silicide. In other words, there is a gap in the silicide layer between gate 218 and N+ region 130. The implantation of N-well 206 is lighter than the implantation of N+ region 130. N-well 206 is necessary for the formation of channel 222 upon application of a positive voltage to gate 218. Increasing the resistance from drain 228 to source 110 with drain displacement and n-well implantation increases the point required for the depletion region surrounding drain 228 extends through channel 222 to source 110. As a result, the voltage at which punch through occurs increases. In addition to increasing the voltage required for punch through to occur, the displacement of N+ region 130 from gate 218 and implantation of n-well 206 onto NMOS structure 200 reduces the hot carrier effect. As a result in the increase in the resistance from drain 228 to source 110, more energy is required for current carriers to leave substrate 102 and tunnel into gate oxide 112. For example, as compared to NMOS structure 100, because of the increase in the resistance from drain 228 to source 110 of NMOS structure 200, the carrier electrons in channel 222 of NMOS structure 200 require more energy to leave substrate 102 and tunnel into gate oxide 112.

The point at which avalanche breakdown occurs relates to the resistance from drain 228 to substrate 102. For example, a transistor with a greater drain to substrate resistance has a greater avalanche breakdown voltage than a transistor with a lesser drain to substrate resistance. This resistance decreases the influence of the electric field on the drain requiring more energy for the carriers to break covalent bonds in atoms with which they collide. An exemplary embodiment of NMOS structure 200 uses n-well 206 to increase the resistance from drain 228 to substrate 102. Implantation of n-well 206 creates a larger n-type region in NMOS structure 200 as compared to NMOS structure 100. The n-type region in NMOS structure 200 comprises both N+ region 130 and n-well 206. As a result of this larger n-type region, the p-n junction between the n-type region and substrate 102 is larger, thereby increasing resistance from drain 228 to substrate 102. For an equivalent drain region, the resistance from drain 228 to substrate 102 for NMOS structure 200 is greater than the resistance from drain 228 to substrate 102 for NMOS structure 100. The increase in resistance from drain 228 to substrate 102 in NMOS structure 200 requires a larger voltage to accelerate carrier electrons to knock free atoms.

The point at which the breakdown of the gate oxide occurs relates to the height of gate oxide 112. For example, a transistor with a greater gate oxide height has a greater gate oxide breakdown voltage than a transistor with a lesser gate oxide height. An exemplary embodiment of NMOS structure 200 uses the principal of poly depletion to increase both the effective thickness of gate oxide 112 and the voltage at which breakdown of gate oxide 112 occurs. Poly depletion is a parasitic effect whereby a voltage drop across the gate of a transistor causes the formation of a depletion layer. This depletion layer depletes the gate of current carriers increasing the effective gate oxide thickness. Fabrication of the gate with either heavily implanted poly silicon or a metal minimizes the effect of poly depletion. By fabricating the gate with either heavily implanted poly silicon or metal provides the gate with excess of current carriers making the formation of a depletion layer across the gate more difficult.

Another exemplary embodiment of the present invention lightly implants gate 218 with an n-type material to form an N− region. The "−" indicates that the region is implanted with a lower carrier concentration than a region not designated by a "−." For instance, a P− region typically has a lesser number of excess carrier holes than a P+ region. An N− region generally has a lesser number of excess carrier electrons than an N+ region. In one embodiment, gate 218 of NMOS structure 200 is lightly implanted with n-type material on the order of $10^{18}$ as compared to the heavy implantation on the order of $10^{20}$ for gate 118 of NMOS structure 100. The removal of excess electrons in NMOS structure 200 makes the formation of a depletion layer across gate 218 easier as compared to NMOS structure 100, thereby increasing the effective thickness of gate oxide 112. As a result of the increased effective thickness of gate oxide 112, the point at which the breakdown of gate oxide 112 occurs is increased.

The threshold voltage is the gate to source voltage at which a sufficient number of mobile electrons accumulate in channel 222 to form a conducting channel. The p-type substrate used to fabricate NMOS structure 200 contains more carrier holes as compared to carrier electrons. By applying a voltage to gate 218, the corresponding electric field causes the carrier electrons in the substrate to become concentrated at the region of substrate 102 nearest gate 218. A depletion region forms when the concentration of carrier electrons is equal to that of the carrier holes. NMOS structure 200 turns on when voltage applied at gate 218 is larger than the threshold voltage. NMOS structure 200 turns on because there are more carrier electrons than carrier holes in substrate 102 near gate 218. To increase the number of holes located in substrate 102, NMOS structure 200 implants p-well 204 starting from shallow trench isolation 108a, extending beneath source 110, and terminating at well transition 226. Well transition 226 is a region in substrate 102 where a region comprised of p-well 204 changes to a region comprised of n-well 206. By increasing the number of holes in substrate 102, formation of the depletion region requires a greater number of electrons. Implanting p-well 204 onto substrate 102 in NMOS structure 200 increases the threshold voltage, as more electrons are required to accumulate in channel 222. In an exemplary embodiment, well transition 226 is displaced horizontally 0.2 μm from the edge of gate 218 adjacent to drain 228.

Figure 2B:
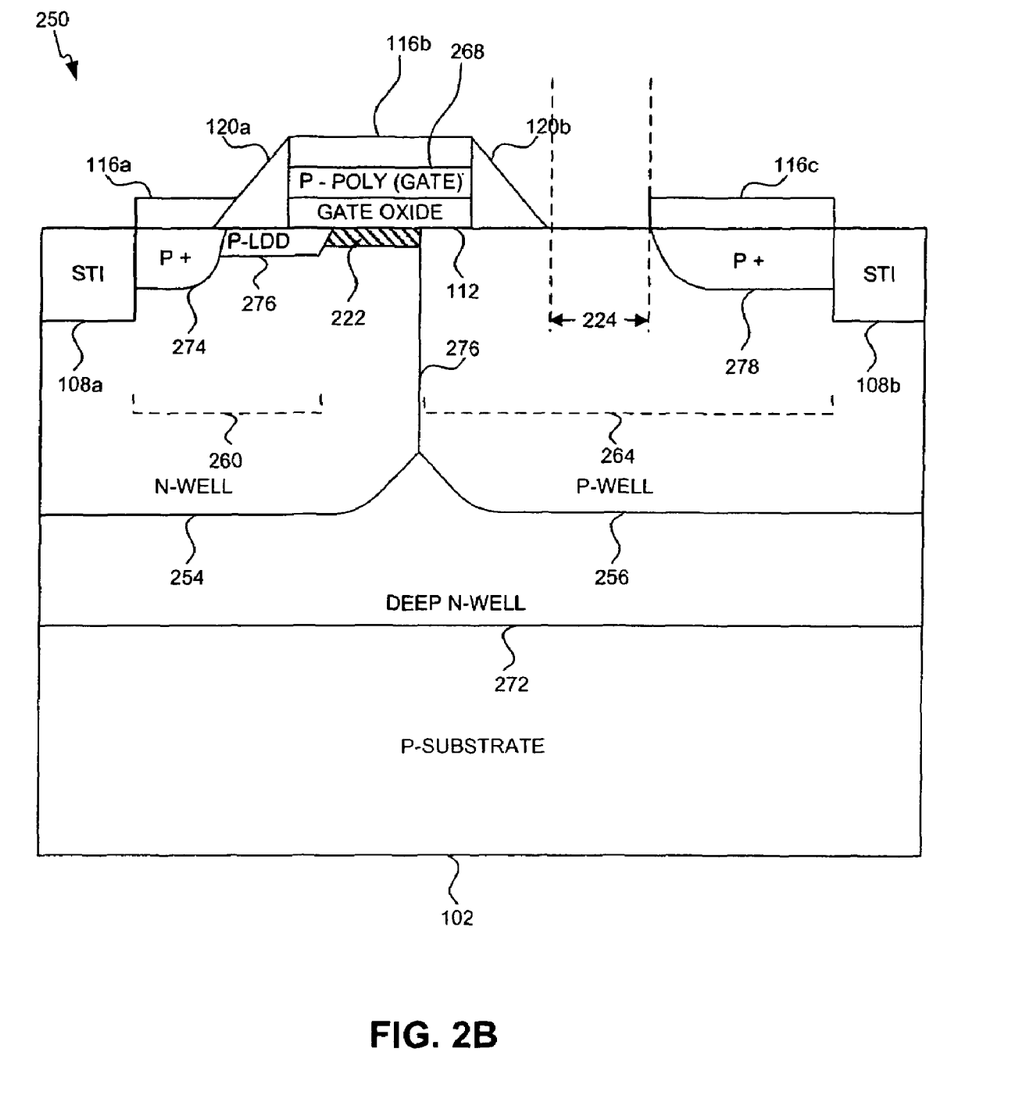
FIG. 2b illustrates a cross-sectional view of a p-type metal oxide semiconductor (PMOS) structure according to an embodiment of the present invention.

FIG. 2B illustrates a cross-sectional view of a p-type metal oxide semiconductor (PMOS) structure according to an embodiment of the present invention. The same conventional CMOS logic foundry technology as NMOS structure 100 also fabricates PMOS structure 250, but without the additional masking or processing cost required by existing techniques.

The conventional CMOS logic foundry technology fabricates PMOS structure 250 by implanting a deep n-well 272 onto a p-type substrate 102. P-LDD region 276 is in contact with P+ region 274. P-LDD region 276 is lightly implanted with p-type material to provide a high resistance shallow diffusion region. P-LDD region 276 provides a high resistance shallow diffusion region from P+ region 274 to gate 268 to reduce the effects of the electric field of P+ region 274. In contact with deep n-well 272 are n-well 254 and p-well 256. Drain 264 of PMOS structure 250 includes P+ region 278 and P-well 206. Well transition 276 is a region in substrate 102 where a region comprised of n-well 254 changes to a region comprised of p-well 256. Shallow trench isolation regions 108a and 108b can provide isolation and protection for PMOS structure 250. Shallow trench isolation region 108a is in contact with source 260, while shallow trench isolation 108b is in contact with drain 264. Polycrystalline silicon gate 268 is located in between source 260 and drain 264 on top of gate oxide 112. Channel 222 extends from source 260 to well transition 276 located beneath gate 268. Spacers 120a and 120b are included at the ends of the gate 268. Spacer 120a is adjacent to source 260 and in contact with gate 268 while spacer 120b is adjacent to drain 264 and in contact with gate 268. Placed upon source 260, gate 218, and drain 264 of NMOS structure 200 is a layer of suicide 116.

PMOS structure 250 increases the point at which breakdown occurs by the same techniques as NMOS structure 200. An exemplary embodiment of PMOS structure 250 displaces P+ region 278 from gate 268 by displacement distance 224 and implants p-well 256 to increase the voltage at which both punch through and the hot carrier effect occur by increasing the resistance from drain 264 to source 260. Another exemplary embodiment of PMOS structure 250 uses p-well 256 to increase the voltage at which avalanche breakdown occurs by increasing resistance from drain 264 to substrate 102. A further exemplary embodiment of PMOS structure 250 raises the breakdown point of gate oxide 112 by lightly implanting gate 268 with a p-type material to form a P– region. Those skilled in the art will recognize that PMOS structure 250 operates in a manner similar to that of NMOS structure 200.

Figure 3A:
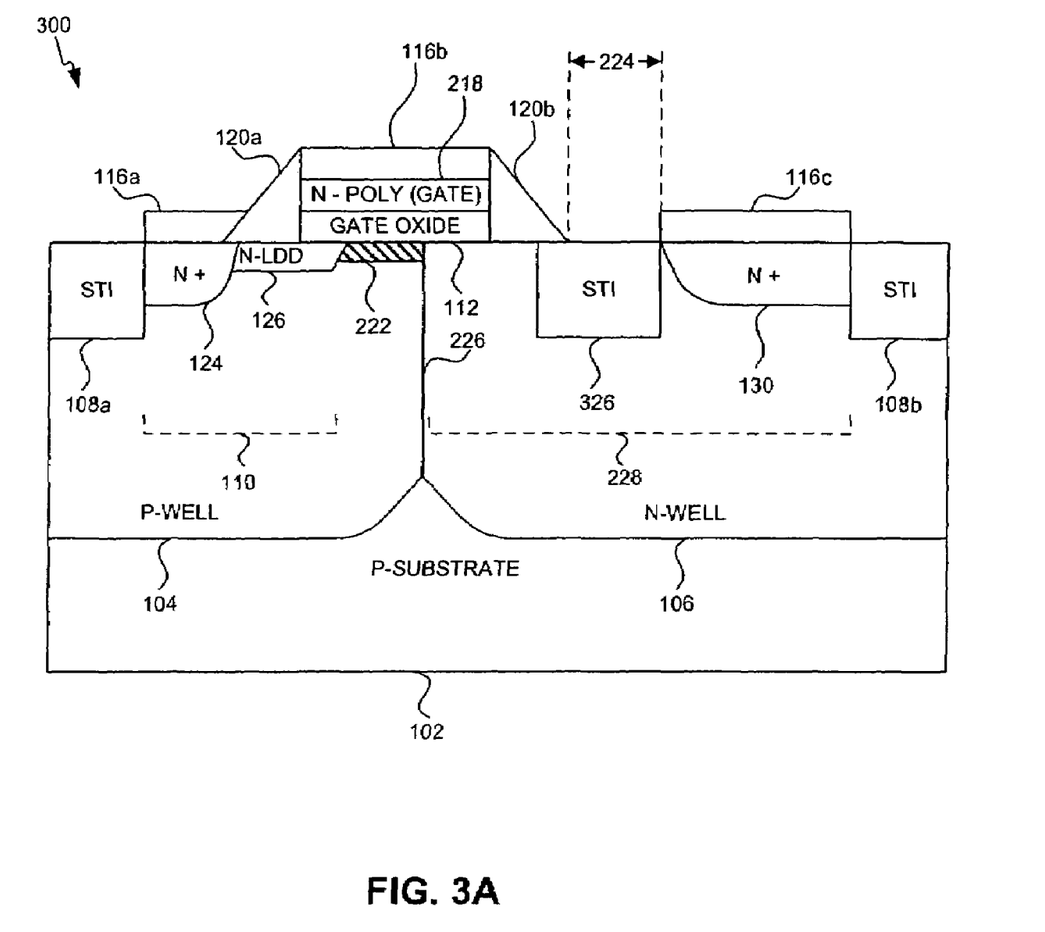
FIG. 3a illustrates a cross-sectional view of an n-type metal oxide semiconductor (NMOS) structure with shallow trench isolation according to an embodiment of the present invention.

FIG. 3A illustrates a cross-sectional view of an n-type metal oxide semiconductor (NMOS) structure with shallow trench isolation according to an embodiment of the present invention. The same conventional CMOS logic foundry technology as NMOS structure 100 also fabricates NMOS structure 300, but without the additional masking or processing cost required by existing techniques.

The conventional CMOS logic foundry technology fabricates NMOS structure 300 onto a p-type substrate 102. Source 110 of NMOS structure 300 includes N+ region 124 and N-LDD region 126. N-LDD region 126 is in contact with N+ region 124. N-LDD region 126 is lightly implanted with n-type material to provide a high resistance shallow diffusion region. N-LDD region 126 provides a high resistance shallow diffusion region from N+ region 124 to gate 218 to reduce the effects of the electric field of N+ region 124. Drain 228 of NMOS structure 300 includes N+ region 130 and n-well 106. P-well 104 is located below source 110. Well transition 226 is a region in substrate 102 where a region comprised of n-well 106 changes to a region comprised of p-well 104.

Shallow trench isolation region 108a is in contact with source 110, while shallow trench isolation 108b is in contact with drain 228. Placed in between drain 228 and gate 218 is a third shallow trench isolation region 326. Polycrystalline silicon gate 218 is located in between source 110 and drain 228 on top of gate oxide 112. Channel 222 extends from source 110 to well transition 226 located beneath gate 218. Spacers 120a and 120b are included at the ends of the gate 218. Spacers 120a and 120b are included at the ends of the gate 218. Spacer 120a is adjacent to source 110 and in contact with gate 218 while spacer 120b is adjacent to drain 228 and in contact with gate 218. Placed upon source 110, gate 218, and drain 228 of NMOS structure 300 is a layer of silicide 116.

NMOS structure 300 increases point at which breakdown occurs by the same techniques as NMOS structure 200. An exemplary embodiment of NMOS structure 300 displaces N+ region 130 from gate 218 by displacement distance 224 and implants n-well 106 to increase the voltage at which both punch through and the hot carrier effect occur by increasing the resistance from drain 228 to source 110. In addition to the techniques used in NMOS structure 200, another exemplary embodiment of NMOS structure 300 includes a shallow trench isolation region 326. Shallow trench isolation region 326 is generally constructed with a dielectric material such as SiO$_2$, though any suitable material can be used. The current flowing through channel 222 must circumvent shallow trench isolation region 326 thereby further increasing the resistance from drain 228 to source 110 of NMOS structure 300 when compared with NMOS structure 200. As a result, the voltage where punch through and hot carrier effect occurs is greater for NMOS structure 300. Another further exemplary embodiment of NMOS structure 300 uses n-well 106 to increase the voltage at which avalanche breakdown occurs by increasing resistance from drain 228 to substrate 102. An additional exemplary embodiment of NMOS structure 300 raises the breakdown point of gate oxide 112 by lightly implanting gate 218 with an n-type material to form an N– region. Those skilled in the art will recognize that NMOS structure 300 operates in a manner similar to that of NMOS structure 200.

Figure 3B:
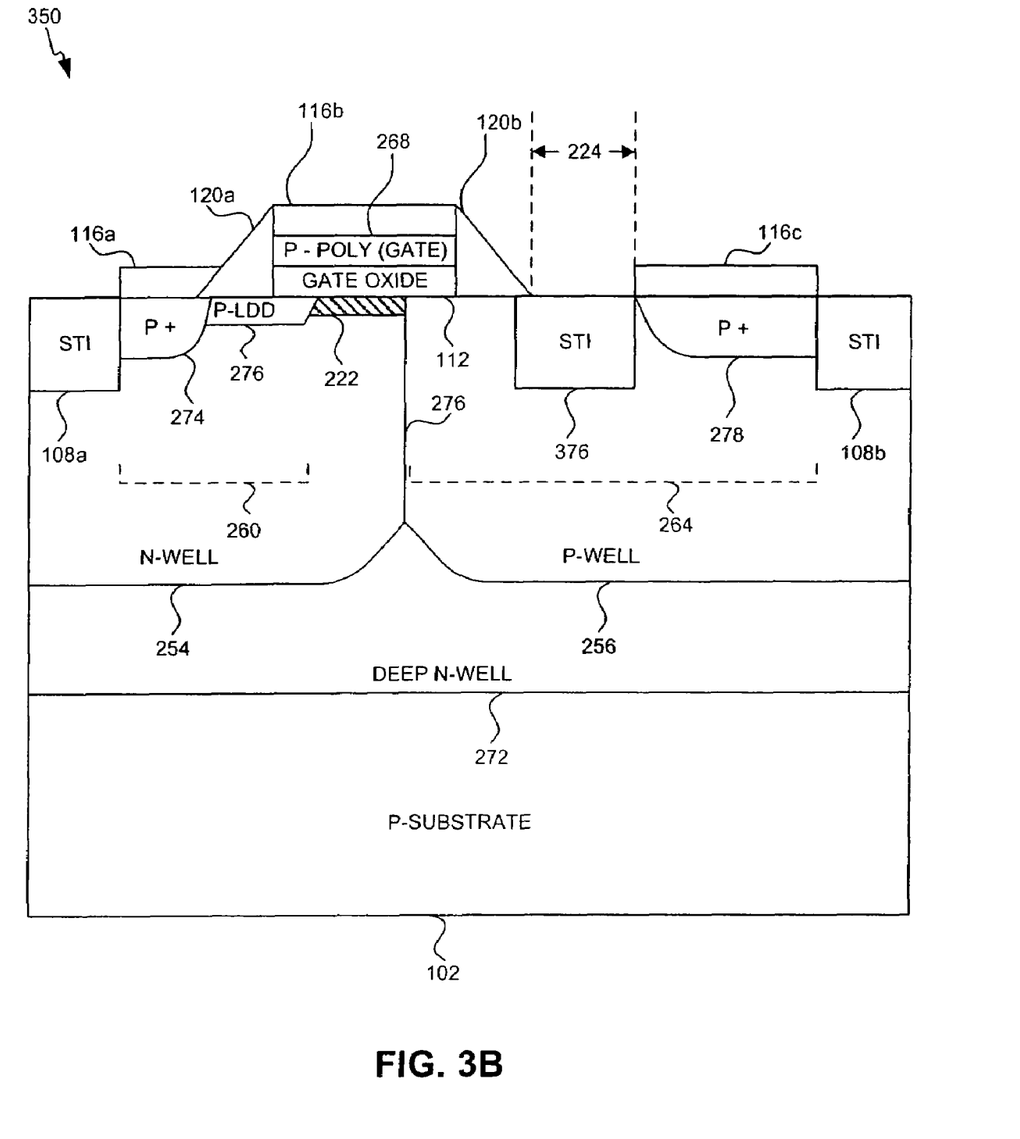
FIG. 3b illustrates a cross-sectional view of a p-type metal oxide semiconductor (PMOS) structure with shallow trench isolation according to an embodiment of the present invention.

FIG. 3B illustrates a cross-sectional view of a P-type metal oxide semiconductor (PMOS) structure with shallow trench isolation according to an embodiment of the present invention. The same conventional CMOS logic foundry technology as NMOS structure 100 also fabricates PMOS structure 350, but without the additional masking or processing cost required by existing techniques.

The conventional CMOS logic foundry technology fabricates PMOS structure 350 by implanting a deep n-well 272 onto a p-type substrate 102. P-LDD region 276 is in contact with P+ region 274. P-LDD region 276 is lightly implanted with p-type material to provide a high resistance shallow diffusion region. P-LDD region 276 provides a high resistance shallow diffusion region from P+ region 274 to gate 268 to reduce the effects of the electric field of P+ region 274. In contact with deep n-well 272 are n-well 254 and p-well 256. Drain 264 of PMOS structure 250 includes P+ region 278 and p-well 256. Well transition 276 is a region in substrate 102 where a region comprised of n-well 254 changes to a region comprised of p-well 256.

Shallow trench isolation regions 108a and 108b can provide isolation and protection for PMOS structure 350. Shallow trench isolation region 108a is in contact with source 260, while shallow trench isolation 108b is in contact with drain 264. Placed in between drain 264 and gate 268 is a third shallow trench isolation region 376. Polycrystalline silicon gate 268 is located in between source 260 and drain 264 on top of gate oxide 112. Channel 222 extends from source 260 to well transition 276 located beneath gate 268. Spacers 120a and 120b are included at the ends of the gate 268. Spacer 120a is adjacent to source 260 and in contact with gate 268 while spacer 120b is adjacent to drain 264 and in contact with gate 268. Placed upon source 260, gate 268, and drain 264 of PMOS structure 350 is a layer of silicide 116.

PMOS structure 350 increases point at which breakdown occurs by the same techniques as NMOS structure 200. An exemplary embodiment of PMOS structure 350 displaces P+ region 278 from gate 268 by displacement distance 224 and implants p-well 256 to increase the voltage at which both punch through and the hot carrier effect occur by increasing the resistance from drain 264 to source 260. In addition to the techniques used in NMOS structure 200, another exemplary embodiment of NMOS structure 300 includes a shallow trench isolation region 326. Shallow trench isolation region 326 is generally constructed with a dielectric material such as SiO$_2$, though any suitable material can be used. The current flowing through channel 222 must circumvent shallow trench isolation region 376 thereby further increasing the resistance from drain 264 to source 260 of PMOS structure 350 when compared with PMOS structure 250. As a result, the voltage where punch through and hot carrier effect occurs is greater for PMOS structure 350. Another further exemplary embodiment of PMOS structure 350 uses p-well 256 to increase the voltage at which avalanche breakdown occurs by increasing resistance from drain 264 to substrate 102. An additional exemplary embodiment of PMOS structure 350 raises the breakdown point of gate oxide 112 by lightly implanting gate 268 with a p-type material to form a P– region. Those skilled in the art will recognize that PMOS structure 350 operates in a manner similar to that of NMOS structure 200.

Figure 4:
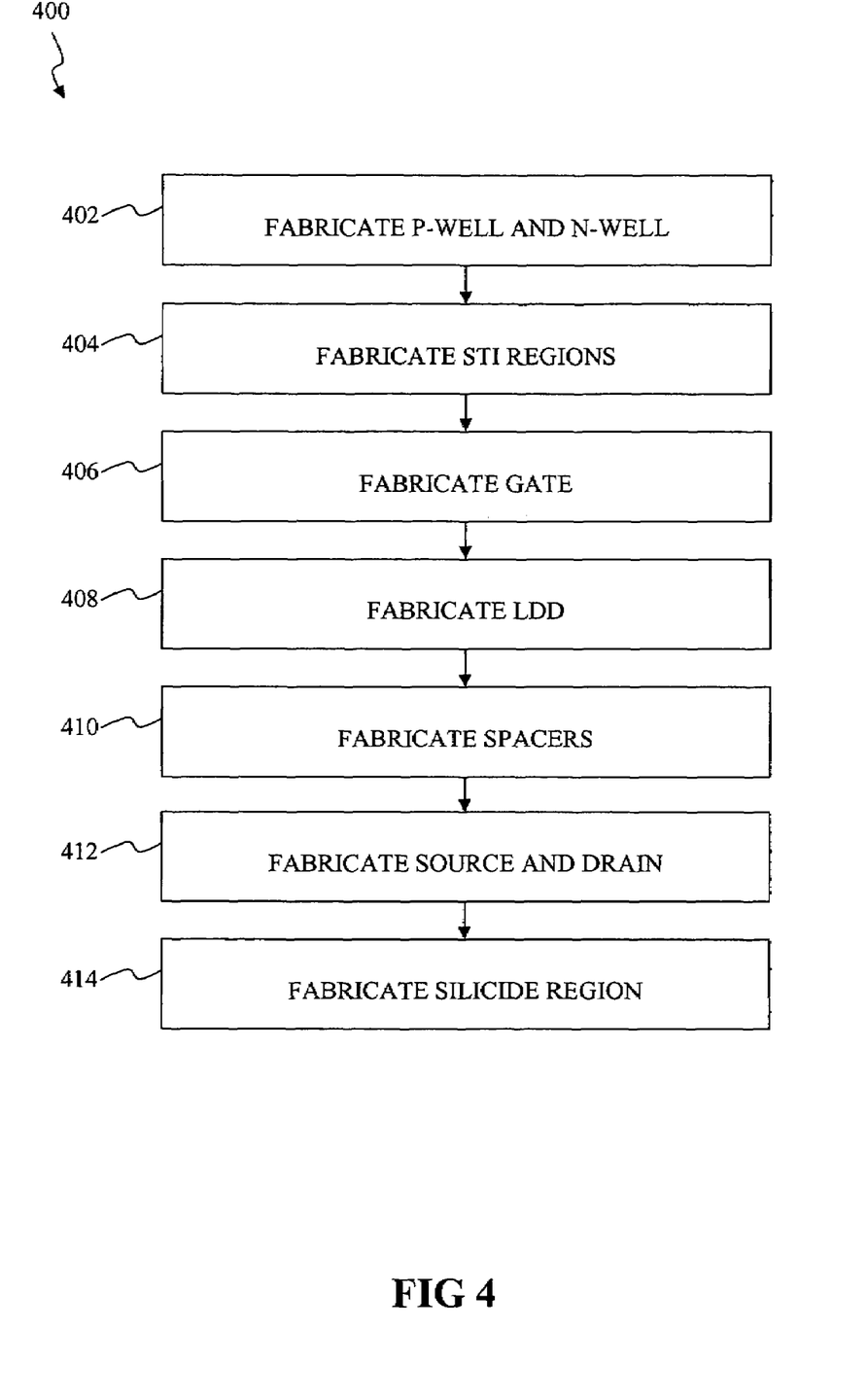
FIG. 4 illustrates an exemplary representation of a CMOS logic foundry process used to fabricate an embodiment of the present invention.

FIG. 4 illustrates an exemplary representation of a CMOS logic foundry process used to fabricate an embodiment of the present invention. In an exemplary embodiment, a conventional CMOS logic foundry technology implements CMOS logic process 400. CMOS logic process 400 creates a transistor by the following steps: fabricate p-well and n-well, denoted as 402, fabricate shallow trench isolation regions, denoted as 404, fabricate gate, denoted as 406, fabricate LDD, denoted as 408, fabricate spacers, denoted as 410, fabricate source and drain, denoted as 412, and fabricate silicide region, denoted as 414.

Fabricate p-well and n-well, denoted as 402, entails implanting a semiconductor substrate with an appropriate impurity to form a p-well or an n-well. Implanting the substrate with boron, a p-type material, forms the p-well, while implanting the substrate with phosphorous or arsenic, both n-type materials, forms the n-well. For an NMOS device, the p-well is located beneath source while the n-well is located beneath the drain. For a PMOS, device the p-well is located beneath the drain while the n-well is located beneath the source. In both instances, the p-well and n-well are in contact with one another forming a transition region whereby the impurity implanted onto the substrate changes from p-type material to n-type material; no isolation region exists in between the n-well and p-well. This transition region is located beneath the gate. In exemplary embodiment, the transition region where the n-well and p-well contact is beneath the gate and horizontally displaced 0.2 μm from the edge of the gate adjacent to the drain.

Fabricate shallow trench isolation regions, denoted as 404, entails depositing an etched semiconductor substrate with a dielectric material such as $SiO_2$, though any suitable material can be used, to form shallow trench isolation regions. Fabricating a shallow trench isolation region adjacent to the drain and another shallow trench isolation region adjacent to the source provides isolation and protection to the transistor. Depositing an additional shallow trench isolation region in between the gate and the drain increases the breakdown voltage of the transistor.

Fabricate gate, denoted as 406, entails implanting a semiconductor substrate with polycrystalline silicon, though any suitable material can be used, on top of a gate oxide to form the gate. Lightly implanting the polycrystalline silicon with the appropriate impurity increases the breakdown voltage of the transistor. Lightly implanting n-type material onto the polycrystalline silicon to form an N– region creates the gate of an NMOS device, while lightly implanting p-type material polycrystalline silicon to form a P– region creates the gate of a PMOS device. In exemplary embodiment, the gate is lightly implanted on the order of $10^{18}$.

Fabricate LDD, denoted as 408, entails implanting a semiconductor substrate with an appropriate impurity to form a LDD region. For example, lightly implanting the substrate with either phosphorous or arsenic, both n-type materials, to create an N– region forms the LDD for an NMOS device. Lightly implanting the substrate with boron, a p-type material, to create a P– region forms the LDD for a PMOS device. When fabricating the LDD for either an NMOS or PMOS device, a portion of the carrier region comprising the LDD overlaps the gate.

Fabricate spacers, denoted as 410, entails depositing a dielectric material such as $SiO_2$, though any suitable material can be used, on top of a semiconductor substrate to form spacers. Each edge of the gate contains a spacer. In other words, one spacer is adjacent to the source and in contact with the gate while another spacer is adjacent to drain and in contact with the gate.

Fabricate source and drain, denoted as 412, entails implanting a semiconductor substrate with an appropriate impurity to form a source and a drain. Heavily implanting the substrate with either phosphorous or arsenic, both n-type materials, to create and N+ region forms the source and the drain for an NMOS device. Heavily implanting the substrate with boron, a p-type material, to create a P+ region forms the source and the drain for a PMOS device. When fabricating the source or the drain for either an NMOS or PMOS device, there is no overlap between the gate and the carrier region comprising the source and the drain. The entire region comprising the drain is horizontally displaced a specified distance from the gate. In an exemplary embodiment, the entire drain region is displaced 0.45 μm from the junction between the gate and a spacer in contact with the gate.

Fabricate silicide region, denoted as 414, entails depositing metal on top of poly silicon and then alloy to create silicide, though any suitable material can be used, on top of the gate, the source, and the drain of a transistor to form the connection between the fabricated transistor and a metallization layer. The metallization layer forms the interconnections between the fabricated transistor and other devices. In an embodiment, the region of the semiconductor substrate in between the gate and the drain lacks silicide. In other words, there is a gap in the silicide layer between the gate and the drain, requiring the removal of any silicide in this region.

CONCLUSION

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above described exemplary embodiments, but should be defined only in accordance with the following claims and their equivalents.

What is claimed is:

1. A metal oxide silicon (MOS) field effect transistor device, comprising:
 a substrate implanted with a first well portion and a second well portion, said first well portion contacting said second well portion to form a well transition, said first well portion being implanted with a source region, said second well portion being implanted with a drain region, said drain region including a heavily implanted region relative to said second well portion;
 a gate region disposed on said substrate between said source region and said drain region, said gate region being lightly implanted relative to said source region and said drain region, said gate region being displaced from said heavily implanted region by a displacement distance; and
 a shallow trench isolation region disposed on said substrate between said heavily implanted region and said gate region, said short trench isolation region not overlapping said gate region.

2. The MOS device of claim 1, wherein said first well portion is a p-well and said second well portion is an n-well.

3. The MOS device of claim 1, wherein said first well portion is an n-well and said second well portion is a p-well.

4. The MOS device of claim 1, wherein said gate region is implanted with carriers on the order of $10^{18}$.

5. The MOS device of claim 1, wherein said displacement distance is a horizontal distance from a spacer to said heavily implanted region, said spacer being in contact with said gate region.

6. The MOS device of claim 5, wherein said horizontal distance is substantially 0.45 μm.

7. The MOS device of claim 1, wherein said source region, said drain region, and said gate region are implanted with n-type material.

8. The MOS device of claim 1, wherein said source region, said drain region, and said gate region are implanted with p-type material.

9. The MOS device of claim 1, wherein said source region includes a second heavily implanted region relative to said first well portion and a lightly implanted region relative to said second heavily implanted region, said lightly implanted region overlapping said gate region.

10. The MOS device of claim 1, wherein said shaloow trench isolation region includes a dielectric material.

11. The MOS device of claim 1, further comprising:
a plurality of silicide regions in contact with said source region, said drain region, and said gate region.

12. The MOS device of claim 11, wherein a gap exists in said plurality of silicide regions between said gate region and said heavily implanted region.

13. The MOS device of claim 1, wherein said source region overlaps said gate region.

14. The MOS device of claim 1, wherein said shallow trench isolation region is horizontally displaced from said gate region.

15. A metal oxide silicon (MOS) field effect transistor device, comprising:
a lightly implanted region forming a gate region having a first edge and a second edge;
an n-well and a p-well implanted onto a semiconductor substrate, said n-well extending beneath said first edge of said gate region to said p-well, said p-well extending beneath said second edge of said gate region to said n-well, said p-well and said n-well contacting each other to form a well transition;
a drain region including a first heavily implanted region displaced from said gate region by a displacement distance, said first heavily implanted region being heavily implanted relative to said gate region;
a source region including a second heavily implanted region, said second heavily implanted region being heavily implanted relative to said gate region; and
a shallow trench isolation region between said drain region and said gate region, said short trench isolation region not overlapping said gate region.

16. The MOS device of claim 15, wherein said well transition is located beneath said gate region, said well transition being horizontally displaced a distance of approximately 0.2 μm from said first edge of said gate region.

17. The MOS device of claim 15, wherein said well transition is located beneath said gate region, said well transition being horizontally displaced a distance of approximately 0.2 μm from said second edge of said gate region.

18. The MOS device of claim 15, wherein said gate region is implanted with carriers on the order of $10^{18}$.

19. The MOS device of claim 15, wherein said displacement distance is a horizontal distance from a spacer to said drain region, said spacer being in contact with said gate region.

20. The MOS device of claim 19, wherein said displacement distance is substantially 0.45 μm.

21. The MOS device of claim 15, wherein said drain region and said gate region are implanted with n-type material.

22. The MOS device of claim 15, wherein said drain region and said gate region are implanted with p-type material.

23. The MOS device of claim 15, wherein said shallow trench isolation region includes a dielectric material.

24. The MOS device of claim 15, further comprising:
a plurality of silicide regions in contact with said drain region and said gate region.

25. The MOS device of claim 24, wherein a gap exists in said plurality of silicide regions between said gate region and said heavily implanted region.

26. The MOS device of claim 15, wherein said shallow trench isolation region is horizontally displaced from said gate region.

27. The MOS device of claim 15, wherein said source region overlaps at least one of: said first edge of said gate region and said second edge of said gate region.

* * * * *

UNITED STATES PATENT AND TRADEMARK OFFICE
CERTIFICATE OF CORRECTION

| | |
|---|---|
| PATENT NO. | : 7,855,414 B2 |
| APPLICATION NO. | : 11/580961 |
| DATED | : December 21, 2010 |
| INVENTOR(S) | : Ito et al. |

It is certified that error appears in the above-identified patent and that said Letters Patent is hereby corrected as shown below:

At column 11, line 14, "shaloow" should be replaced with --shallow--.

Signed and Sealed this
Twenty-sixth Day of April, 2011

David J. Kappos
*Director of the United States Patent and Trademark Office*